United States Patent [19]
Eisfeller et al.

[11] Patent Number: 5,284,679
[45] Date of Patent: Feb. 8, 1994

[54] METHOD FOR MAKING BRIGHT TRIM ARTICLES

[75] Inventors: Richard Eisfeller, Greenland; Gerard Vachon, Somersworth, both of N.H.

[73] Assignee: Davidson Textron Inc., Dover, N.H.

[21] Appl. No.: 977,219

[22] Filed: Nov. 16, 1992

[51] Int. Cl.$^5$ .............................. B05B 3/02; B05B 3/12
[52] U.S. Cl. .................................... 427/240; 427/379; 427/381; 427/409; 427/425
[58] Field of Search ............... 427/240, 241, 379, 381, 427/409, 425

[56] References Cited

U.S. PATENT DOCUMENTS

| | | | |
|---|---|---|---|
| 2,992,125 | 7/1961 | Fustier | 117/7 |
| 2,993,806 | 7/1961 | Fisher et al. | 117/71 |
| 3,118,781 | 1/1964 | Downing | 117/33.3 |
| 3,914,472 | 10/1975 | Nakanishi et al. | 427/250 |
| 3,952,699 | 4/1976 | Dürr et al. | 118/315 |
| 4,101,698 | 7/1978 | Dunning et al. | 428/31 |
| 4,131,530 | 12/1978 | Blum et al. | 204/192 |
| 4,211,822 | 7/1980 | Kurfman et al. | 428/412 |
| 4,215,170 | 7/1980 | Oliva | 429/328 |
| 4,312,292 | 1/1982 | Smith et al. | 118/320 |
| 4,431,711 | 2/1984 | Eisfeller | 428/31 |
| 4,640,846 | 2/1987 | Kuo | 427/240 |
| 4,713,143 | 12/1987 | Eisfeller | 156/655 |
| 4,806,504 | 2/1989 | Cleeves | 427/240 |
| 4,874,639 | 10/1989 | Matsui et al. | 427/240 |
| 4,888,213 | 12/1989 | Hesterberg | 427/240 |
| 4,919,977 | 4/1990 | Yamane et al. | 427/379 |

FOREIGN PATENT DOCUMENTS 0167024 10/1982 Japan ....................... 427/240

Primary Examiner—Asok Pal
Attorney, Agent, or Firm—Reising, Ethington, Barnard, Perry & Milton

[57] ABSTRACT

A bright trim article is manufactured by a process including applying a primer coat material to the outer surface of a raw part and thereafter applying a dielectric substrate basecoat by rotation and spray painting to prevent orange peel; thereafter vacuum metallizing a corrosion prone metal, namely indium, on the dielectric substrate basecoat to form "islands" of the indium that are etched following the growth of the metal as it is deposited after the nucleation stage and the stage of channelization but before the formation of an electrically conductive film; thereafter applying a clear resinous topcoat material by rotating the base-coated part and spraying the resinous topcoat material to prevent an orange peel surface while filling the channels and covering the islands to encapsulate and insulate the islands, one from another.

A preferred application of this invention is the manufacture of trim parts for the automotive, plumbing and building industries.

12 Claims, 2 Drawing Sheets

METHOD FOR MAKING BRIGHT TRIM ARTICLES

TECHNICAL FIELD

This invention pertains to bright trim articles and more particularly to a method for manufacturing bright trim articles by vapor deposition of island formation amphoteric materials on a rotationally coated spray base material and by rotationally coating a clear top coat material on the vapor deposited material.

BACKGROUND ART

Vacuum metallizing of plastic and similar dielectric substrates is disclosed in various forms including U.S. Patent:
- U.S. Pat. No. 2,992,125 Fustier
- U.S. Pat. No. 2,993,806 Fisher
- U.S. Pat. No. 3,118,781 Downing
- U.S. Pat. No. 3,914,472 Nakanishi
- U.S. Pat. No. 4,101,698 Dunning
- U.S. Pat. No. 4,131,530 Blum
- U.S. Pat. No. 4,211,822 Kaufman
- U.S. Pat. No. 4,215,170 Oliva Prior U.S. Pat. No. 4,431,711 issued Feb. 14, 1984, relates to metal film island structure and spacing to the appearance and performance of a commercial product, to the conductivity of the metal layer, to the corrosion resistance of the metal layer and/or to the adhesion of the top coat. It further relates to nucleation and film growth to a desired island structure and spacing that achieves these ends.

With regard to the last statement, two excellent reference books are:

*Thin Film Phenomena*, Kasturi L. Chopra, Robert E. Kreiger Publishing Company, Huntington, N.Y., 1979. See especially pp. 163 et seq.

*Handbook of Thin Film Technology*, Leon I. Maissel and Reinhard Glang, McGraw-Hill Book Company, New York, N.Y., 1970. See especially pp. 8-32 et seq.

These texts discuss and illustrate the stages of metal film growth by vacuum deposition from metal nucleation and nuclei growth, to liquid coalescence, to electrically discrete islands, channelization with incipient film conductivity, and finally, full continuous film formation. Film formation of vacuum deposited metals on plastic substrates for commercial products, especially on elastomeric plastic substrates, is not discussed. Nor is the interdependence of the natures of the metal film and the top coating correlated with product performance.

U.S. Pat. No. 4,431,711 shows the significant difference in performance to be obtained with a vacuum metallized flexible plastic product, top coated, where the metal particles are coalesced only to the island state instead of being allowed to coalesce to beyond the channelization stage where film conductivity is established.

In the '711 patent, the separate islands are coalesced from separate nucleation points and are globular or rounded and fused appearing and are part of the nucleation and growth process.

In general, the coalesced islands forming the indium films of the '711 patent are smaller and there is a much greater spacing between them that can be filled with the resin of the top coating, in effect encapsulating the islands and binding them to the substrate surface. The rounded islands are better protected by the resin and the film over all is far more corrosion resistant, surprisingly so. The metal film is much more securely adhered to the substrate—a very significant advantage. The appearance of the globular island product is better—it is more specular, more reflective.

The construction of the indium island structure in U.S. Pat. No. 4,431,711 includes islands that are separated by channels which receive the top coat to bond the resinous film of the top coat to the substrate for the indium island structures. While the island structures are suitable for their intended purpose, it has been observed that the channels formed between the individual islands also contain many clusters and smaller islands of residual material. It is believed that this material reduces the total effective area of substrate material to which the top coat can be bonded. Consequently, the resultant bright trim article may be subject to undesirable delamination between the top coat and the substrate material.

U.S. Pat. No. 4,713,143 discloses a corrosion resistant vacuum metallized article of bright metallic material in which a dielectric substrate surface has a vacuum deposited layer of metal selected from a group consisting of indium and alloys thereof which alloys are predominantly of indium and wherein the vacuum deposition is continued only until there is a formation of discrete islands which visually appear as a continuous film, but that have channels formed between the discrete islands of a dimension so as to maintain the islands electrically non-conductive over the surface area of the substrate, wherein the process includes etching the vacuum deposited discrete islands with a solvent which slowly dissolves or removes residual amounts of indium from the channels between the distinct islands so as to clear the channels to expose additional bonding surfaces on the substrate for increasing the surface area of adhesion between the substrate and a protective dielectric top coat.

The deposited islands are formed by indium which is amphoteric and thus has some solubility in both acids and bases. As deposited, the indium metal layer is composed of tiny islands ranging from tiny clusters of 25 angstroms or less in diameter. The tiny clusters are barely resolvable in the transmission electronic microscope. The islands can increase in diameter to sizes as large as 4,000 angstroms in diameter. Each of the islands is separated by channels which can be several hundred angstroms wide. However, in the deposition process to form the aforedescribed indium island structure, it is observed that many clusters and small islands of residual indium material may exist in the channels which produce the desired electrically non-conductive characteristics across the surface of the substrate. The process of my '143 patent includes etching the previously deposited indium material with a solution that slowly dissolves or removes the small clusters and islands to clean the channels and thereby define an additional surface area against which the top coat can adhere to the base coat so as to improve its adhesion to the base coat. The typical adhesion strength of a top coat material to a base coat material is in the order of 2 orders of magnitude stronger than the adhesion strength of the top coat to the metal making up the individual island structures separated by the channels. The treatment steps for vacuum deposited islands just before top coating consists of rinsing the part in a 10% NaOH solution for 60 to 90 seconds in a temperature range of 150°-160° F. followed by two water rinses and a second rinse with deionized water. This etch treatment step greatly improves the adhesion of top coat material of the type set forth in U.S. Pat. No. 4,431,711. While the flexible substrate described in U.S. Pat. No. 4,431,711 has sufficient adhesion to pass most automotive specification tests, it is desirable to improve the adhesion in such article so that it will consistently pass an X-scribed type taped adhesion test after either Florida exposures or accelerated weathering tests including (QUV, weatherometer, xenon, dual carbon arc weatherometer). With increasing emphasis on quality in American made cars, such tests are now beginning to show up in automotive specifications (see, for example, Fisher Body FBMS 1-51 specification). While etching the island containing metal layers of the type described in U.S. Pat. No. 4,431,711, an improved adhesion between top coat and base coat materials results so that such X-scribed standards can be met. While suitable for their intended purpose, such articles that are spray coated can have a surface finish that is referred to as either an orange peel surface or spray mottled surface. The effect is due to the failure of either the base coat or the clear coat spray coating to flow to a smooth, level surface. Such lack of smoothness can undesirably reduce the specularity or mirror-like quality of the images visually seen in coatings including the metal film comprised of the island containing layer.

Various methods for smoothly coating articles are known including those set-forth in U.S. Pat. Nos. 3,952,699; 4,312,292; 4,874,639; and 4,919,977.

The '292 patent includes spray coating a tile that is mounted on a rotatable horizontal platform that carries a second rotatable platform for rotating a part to be coated in a second plane that is inclined at an angle to the horizontal.

The '639 and '977 patents are directed to a method for spray coating automobile bodies. The method in the '977 patent includes mounting the bodies on their central axis and rotating the bodies about such axes with respect to spray painting devices. Alternatively, the method set-forth in the '699 patent includes mounting the spray paint devices on a rotating platform and driving the spray guns about the car body. The method set forth in the '699 patent requires careful selection of the wetness of the spray coating to prevent runs on the vertical surfaces of the car body.

None of the aforesaid patents are related to a method for improving the specularity of bright trim parts having a metallic island structure for a chrome like appearance while maintaining a discontinuity across the metal layer in the trim part to prevent corrosion therein. Specifically, the aforesaid patents do not disclose a method for manufacturing a bright trim product having reduced orange peel effect or spray coating mottle so as to improve specularity of a bright metal island film deposition thereon.

Furthermore, none of the aforesaid patents include a reel rotation step that will accommodate the manufacture of a plurality of parts at the same time without requiring separate mounting and rotation of the individual parts on their own axes.

PRESENT INVENTION

An object of the present invention is to provide an improved method for manufacturing bright trim articles by spray coating surfaces on fixed axis rotating parts so as to reduce spray mottling or orange peel surface effects on spray coated surfaces thereof.

A further object is to provide a method for producing such smooth surface and high specularity bright trim articles including precoating and protective coating the article with a spray coat step that significantly reduces orange peel surface effects on the bright trim articles so as to enhance the specularity of a thin film, island deposited metal thereon.

Another object of the present invention is to provide such an improved method of manufacture wherein the spray coating is produced during rotation of the parts on a reel that is passed in a vertically disposed circle pattern with respect to a spray paint gun.

A further object of the present invention is to manufacture bright trim parts by a method that includes the step of depositing metal islands on a spray coated surface of a part that is fixed against rotation on its own axis but which is rotated on a reel with respect to a spray gun to product a surface smoothness of 100 DOI and thereafter coating a clear top coat over the metal islands by spraying the top coat on the metal deposited material while the part is rotated on a substantially horizontal axis other than its own axis thereby to produce a surface smoothness of the clear top coat of 100 DOI.

The present invention includes a method for manufacturing a bright trim article having a surface covered by laminated coats including coating a layer of primer material on the surface; further including the step of rotationally spray painting a layer of basecoat material such as an organic dielectric plastic over the prime coat; further including deposition of a layer of a macroscopically continuous-appearing film of a vacuum deposited corrosion prone metal, specifically indium and alloys thereof consisting predominantly of indium and acting in much the same manner as pure indium. Preferably, the alloys each have a melting point in the range of 125° to 250° C. The resultant film is in the form of minute specular electrically discrete rounded metal islands with etched channels formed therebetween defining a high adhesion force bonding surface between the top coat and the article of manufacture; and thereafter rotationally spray painting a top coat layer over the metal film so as to encapsulate and protect the metal particles and binding them firmly to the substrate while producing a surface smoothness of 100 DOI with minimal orange peel or spray mottling thereon.

The resultant product is particularly useful in the bright trim applications for the automotive, plumbing and building industries.

The invention will now be described by way of the following examples and with reference to the accompanying drawing, with it being understood that other advantages and a more complete understanding of the invention will be apparent to those skilled in the art from the succeeding detailed description of the invention and the accompanying drawing hereto.

DETAILED DESCRIPTION OF THE PRESENT INVENTION

Figure 1:
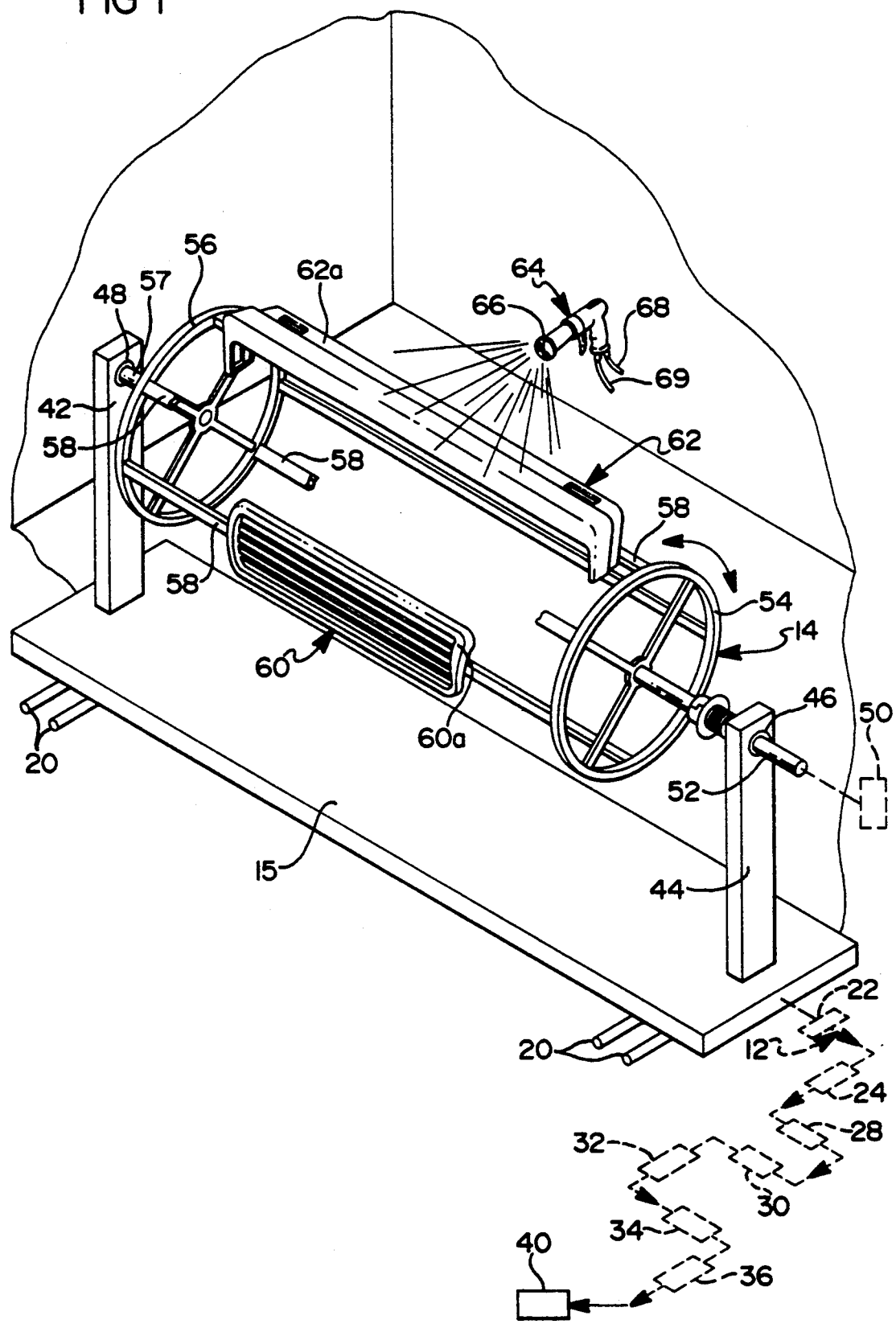
FIG. 1 is a diagrammatic view of the apparatus for practicing he method of the present invention.

The apparatus 10 shown in FIG. 1 is associated with a conveyor line 12 having a plurality of individual pallets 15 each adapted to carry a reel 14 of the present invention. The apparatus includes loading and unloading stations (nor shown) at which raw parts are loaded onto the pallet mounted reels 14. The conveyor line 12 has spaced rollers 20 that can be of the live roller type as more specifically set-forth in copending U.S. application Ser. No. 887,045, filed May 22, 1992 now U.S. Pat. No. 5,174,434 and commonly assigned with the present application.

The raw parts are carried on the pallet mounted reels 14 through a wash station 22 and then through an oven 24 for drying the surfaces of the raw parts. The dry off oven 24 can have a cool down pass for cooling the raw parts prior to being prime coated. The apparatus 10 includes a primer spray booth 28 with a manual sprayer head or a spray paint robot. During the prime coating step, the reel is rotated in accordance with a process to be described to produce surface smoothness of 100 DOI on the primed surfaces of the raw part.

The primed part is then directed through a paint bake oven 30 and to a base coat spray booth 32 having either a manual sprayer or a spray paint robot wherein the prime coated parts can be reel rotated with respect to a spray gun for applying a base coat thereon having a surface smoothness of 100 DOI.

Following application of the base coat, the pallet mounted reels 14 and parts thereon are directed through a flash off tunnel 34 in which solvents are flashed from the base coat for recovery. The pallet mounted reels are then directed through a paint bake oven 36 with a cool down pass. The base coated parts are then conveyed to a vacuum metallizer station 38 having a vacuum chamber that houses the metallizing apparatus as is more specifically set forth in U.S. Ser. No. 856,713, filed Mar. 24, 1992 now U.S. Pat. No. 5,198,272 and commonly assigned with the present application.

Following metallizing, the parts are etched as discussed in U.S. Pat. No. 4,713,143 that is incorporated herein by reference as representative of a suitable etching process.

The apparatus 10 further includes a top coat spray booth 40 that receives the etched and washed parts from the etcher. The island metallized and etched parts can be fixed on their axis but are rotated on the reel 14 with respect to a spray gun either manually or on a spray paint robot. Once top coat is applied, the part on the pallet mounted reel 14 is passed sequentially through a flash off tunnel for flashing solvents from the top coated parts for recovery of the solvents; through a paint bake oven and thence through a cool down tunnel to the unload and load stations where the finished parts are removed from the reels 14.

Accordingly, an important aspect of the present invention is that the parts are rotated about a reel axis throughout all the coating steps of the process so as to prevent orange peel or mottling effects in each and all of the surface coatings.

In FIG. 1, reel 14 is supported on a pallet 15 by two spaced columns 42, 44 at journals 46, 48 therein. A drive system 50 is connected to an input drive shaft 52 that has one end thereof journaled in the column 44 and the other end thereof connected to a spider wheel 54 on one end of the support reel 14. The support reel 14 is connected on an opposite spider wheel 56 to a support shaft 57 that is supported by the journal 48 within the column 42.

The support reel 14 is representatively shown as including a plurality of cross arms 58 extending between and connected to the spider wheels 54, 56 at the outer periphery thereof.

A plurality of bright trim articles such as a front exterior trim grille 60 and bumper fascia 62 are supported fixedly on the support reel so that the bright trim article will not rotate on its own axis.

In certain instances such as door hardware parts, the process may additionally require rotation of the panel on its own axis to obtain adequate coverage during metallizing and coating steps. The flat surface portion 60a, 62a on each of the bright trim articles will rotate with respect to the axis defined by shafts 52, 57 and with respect to a spray gun 64 having a nozzle 66 and suitable supply tubes 68, 69 for feeding coating material to the nozzle 66 for distribution in a suitable pattern against the exposed surfaces of the grille 60, and bumper fascia 62 both before and after deposition of a film of metal thereon formed of spaced metal islands in accordance with the invention.

Figure 2:
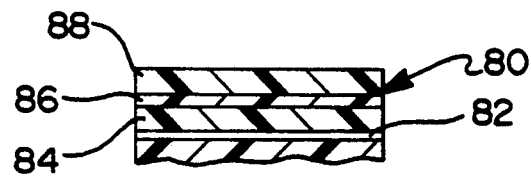
FIG. 2 is a fragmentary sectional view of a multi-layer coating of the present invention.

As shown in FIG. 2, the present invention includes coating articles such as the grille 60 or fascia 62 with a multi-layer coating 80 that is comprised of a primer coat 82 of a urethane resin as described in U.S. Pat. Nos. 4,407,871 and 4,431,711 having a thickness of from 0.1 to 2.0 mils.

The primer coat 82 is covered by a basecoat layer 84 of a suitable polymer material as described in U.S. Pat. Nos. 4,407,871 and 4,431,711, both of which are incorporated herein by reference, having a thickness of 0.1 to 2.0 mils. In accordance with the present invention, the basecoat layer 84 is deposited by a reel coating method to be described. The coating material for the basecoat layer 84 is set forth below:

| Constituent | % by weight |
| --- | --- |
| Light stable aliphatic urethane resin | 20% |

The basecoat layer 84 is covered by a film layer 86 of etched vacuum metallized indium metal islands having a thickness of 25 to 2,000 angstroms that are formed in accordance with the process set forth in U.S. Pat. No. 4,431,711 that is owned by the assignee of the present invention and whose process is hereby incorporated by reference. The etching of the present invention includes the steps of etching the valleys of the indium island coating of the '711 patent by the etching steps set forth in U.S. Pat. No. 4,713,143 also owned by the assignee of the present invention and whose etching steps are also hereby incorporated by reference.

Finally, the multi-layer coating 80 is completed by a reel rotation spray coating step to be described for forming an outer layer of material in the form of a topcoat 88 having a thickness of 0.1 to 2.0 mils that is formed from a protective dielectric plastic material such as a layer of clear polyurethane material as described in U.S. Pat. Nos. 4,431,711 and 4,407,871.

The coating material for the top coat layer 88 is set forth below:

| Constituent | % by weight |
| --- | --- |
| Light stable aliphatic urethane resin | 20% |

Figure 3:
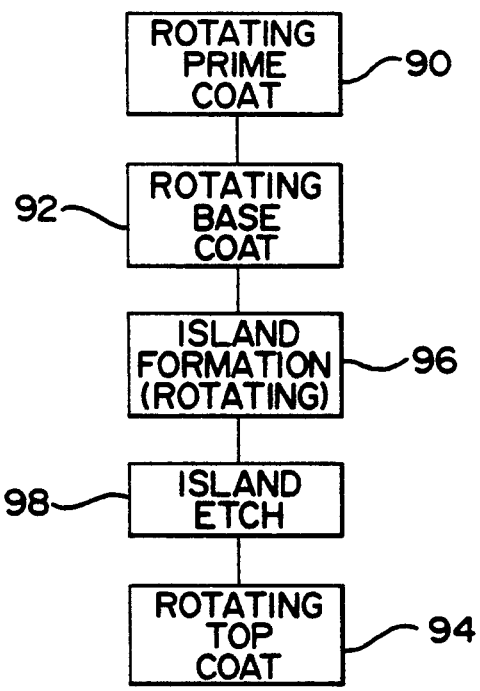
FIG. 3 is a flow chart of the process sequence used in the method of the present invention. The reel 14 is driven by drive system 50 for pivotal rotation about the central horizontal axis.

As shown in FIG. 3, the process of the present invention includes three separate rotation coating steps, including a spraying and rotation prime coating step 90; a spraying and roation base coating step 92; and a spraying and roation top coating step 94. The process includes a rotating metallizing island formation step 96 interposed between the basecoating and topcoating rotation steps. Prior to the topcoating rotation step, the process includes an etching step 98 wherein the island formation is cleared to receive the topcoating.

EXAMPLES OF METHOD FOR MAKING REEL ROTATED BRIGHT TRIM

EXAMPLE No. 1

1. Raw trim part—Ford Part No. F3LB-8200-BAW radiator grille.
2. Reel Rotation—Part fixed on its axis to the reel and reel is rotated on its drive shaft.
3. Primer—Polyurethane resin is applied by spray coating at a reel rotation of between 2 to 15 revolutions per minute. The polyurethane resin has sufficient solids content to be dry enough not to sag while rotating. If the primer applied under these conditions was not rotated, it would sag. This is accomplished by applying primer through a nozzle at an air atomizing pressure of 45 psi and directing the prime coat at a flow rate of 160 ml/min while maintaining the spacing between the part and the spray gun nozzle at approximately 6-8 inches; the dry coated no sag material is then rotated at a speed (preferably 6-8 rpm) to prevent the formation of orange peel so as to form a surface smoothness of 100 DOI; the part is then flashed at room temperature for twenty minutes to remove solvents and then baked for twenty minutes at 260° F. to cure. Thereafter the part is moved to the tunnel for cooling.
4. Basecoat—Polyurethane resin material applied by spray coating a part that is fixed against rotation on its own axis but which is subject to reel rotation of between 2 to 15 revolutions per minute. The polyurethane resin has sufficient solids content to be dry enough not to sag while rotating. If the basecoat applied under these conditions was not rotated, it would sag. This is accomplished by applying primer through a nozzle at an air atomizing pressure of 45 psi and directing the prime coat at a flow rate of 160 ml/min while maintaining the spacing between the part and the spray gun nozzle at approximately 6-8 inches; the dry coated no sag material is then rotated at a speed (preferably 6-8 rpm) to prevent the formation of orange peel so as to form a surface smoothness of 100 DOI; the part is then flashed at room temperature for twenty minutes to remove solvents and then baked for twenty minutes at 260° F. to cure. Thereafter the part is moved to the tunnel for cooling.
5. Metallizing—Indium as applied in U.S. Pat. No. 4,431,711 or equivalent to form separate metal islands.
6. Etch—90 seconds at 160 degrees F. in a 10% sodium hydroxide bath; rinsed and blown off (a seven minute cycle time is typical).
7. Topcoat—Polyurethane resin is applied by spray coating a part that is fixed against rotation on its own axis but which is subject to reel rotation of between 2 to 15 revolutions per minute. The polyurethane resin has sufficient solids content to be dry enough not to sag while rotating. If the topcoat applied under these conditions was not rotated, it would sag. This is accomplished by applying primer through a nozzle at an air atomizing pressure of 45 psi and directing the prime coat at a flow rate of 160 ml/min while maintaining the spacing between the part and the spray gun nozzle at approximately 6-8 inches; the dry coated no sag material is then rotated at a speed (preferably 6-8 rpm) to prevent the formation of orange peel so as to form a surface smoothness of 100 DOI; the part is then flashed at room temperature for twenty minutes to remove solvents and then baked for twenty minutes at 260° F. to cure. Thereafter the part is moved to the tunnel for cooling.

All of the coatings were formed from a polyurethane resin material and the coatings were applied by spray coating from a Binks Model 62 spray gun on a reel that is rotated between 2 to 15 revolutions per minute, but preferably 6-8 RPM.

The aforesaid examples show promising results for bright trim of parts including parts for the automobile, plumbing and building industry. The samples pass initial appearance requirements and adhesion testing including a Gravelometer rating of 6 to 7 SAE J400 gravelometer test—a method for measuring the abrasion resistance of paints.

The parts have DOI=100 that is an improvement of 10 to 30 units compared to bright trim parts manufactured without the reel rotation method of the present invention.

While a grille part is disclosed, the invention is equally suitable for use in other automobile parts such as exterior moldings, bumper guards, door pulls, mirror housings, grille headers, light bezels, and other like automotive trim components. Additional uses for the process are for parts used in plumbing hardware applications; decorative parts for home decoration, trucks, motorcycles and marine parts.

Representative embodiments of the various bright trim high specularity parts of the present invention and their method of manufacture will be readily understood by those skilled in the art and with it being understood that other forms and shapes and method steps are included within the scope of the invention that is only limited within the scope of the appended claims.

What is claimed is:

1. A method for manufacturing a bright trim part comprising the steps of:
   providing a raw uncoated part;
   supporting said raw uncoated part against rotation on its own axis and rotating it with respect to a substantially horizontal axis being spaced from its own axis and not intersecting said part;
   spray coating a prime coat of dielectric urethane resinous material covering on said raw uncoated part as it is rotated with respect to the spaced axis;
   baking the prime coat while fixing it against rotation on its own axis while continuing rotation of the prime coated part about the spaced axis;
   maintaining the primed part against rotation on its own axis and spray coating a basecoat of dielectric urethane resinous material on said baked prime coat as the baked prime coated part is rotated about the spaced axis;

flashing the basecoat to remove solvents therefrom while continuing to rotate the basecoated part on an axis other than its own axis and thereafter cooling the basecoated part while continuing to rotate it on an axis other than its own axis thereby forming a basecoat surface having a smoothness of 100 DOI;

vacuum depositing a layer of corrosion prone metal material covering said basecoat with a plurality of discrete islands, the corrosion prone metal islands appearing visually as a continuous film of such metal and having a plurality of visually unobservable channels between the islands to maintain the film electrically non-conductive over the basecoat layer;

etching the channels while continuing to rotate the vacuum metallized part for clearing the channels for deposition of a top coat material therein; maintaining the etched metallized part against rotation on its own axis and spray coating a topcoat of dielectric urethane resinous material into said channels and across said islands while rotating the etched metallized part on an axis other than its own axis to form a clear top coat there-across; and flashing the topcoat to remove solvents therefrom while continuing to rotate the topcoated part on an axis other than its own axis and thereafter cooling the topcoated part while continuing to rotate it on an axis other than its own axis thereby forming a topcoat surface having a smoothness of 100 DOI.

2. The method for manufacturing a bright trim part set-forth in claim 1, wherein the rotation of the part is carried out in the range of 2 to 15 rpm.

3. The method for manufacturing a bright trim part set-forth in claim wherein the part is rotated during all of the spray coating steps in a range of 2 to 15 rpm.

4. The method for manufacturing a bright trim part set-forth in claim wherein the part is rotated during all of the spray coating steps in a range of 2 to 60 rpm.

5. The method for manufacturing a bright trim part set-forth in claim 1, wherein the part is rotated during all of the spray coating steps in a range of that will prevent the formation of a spray mottled orange peel surface on the finished part.

6. A method for manufacturing a bright trim part comprising the steps of:

providing a raw uncoated part;

supporting said raw uncoated part for rotation about a substantially horizontal axis that does not intersect said part;

rotating the raw part with respect to a spray gun and spray coating a prime coat of dielectric urethane resinous material covering on said raw uncoated part as it is rotated with respect to the spaced axis;

baking the prime coat while continuing rotation of the prime coated part to smooth the surface thereof until orange peel is eliminated therefrom;

rotating the primer part with respect to a spray gun and spray coating a basecoat of dielectric urethane resinous material on said baked prime coat as the baked prime coated part is rotated;

flashing the basecoat to remove solvents therefrom while continuing to rotate the basecoated part and thereafter cooling the basecoated part while continuing to rotate it so as to prevent orange peel formation on the surface of the basecoat;

vacuum depositing a layer of corrosion prone metal material covering said basecoat with a plurality of discrete islands, the corrosion prone metal islands appearing visually as a continuous film of such metal and having a plurality of visually unobservable channels between the islands to maintain the film electrically non-conductive over the basecoat layer;

etching the channels while continuing to rotate the vacuum metallized part for clearing the channels for deposition of a top coat material therein; rotating the etched metallized part with respect to a spray gun and spray coating a topcoat of dielectric urethane resinous material into said channels and across said islands while rotating the etched metallized part to form a clear top coat there-across;

flashing the topcoat to remove solvents therefrom while continuing to rotate the topcoated part and thereafter cooling the topcoated part while continuing to rotate it thereby eliminating the formation of orange peel on the surface of the topcoat.

7. The method for manufacturing a bright trim part set-forth in claim 6, wherein the rotation of the part is carried out in the range of 2 to 15 rpm.

8. The method for manufacturing a bright trim part set-forth in claim 6, wherein the part is rotated during all of the spray coating steps in a range of 2 to 15 rpm.

9. The method for manufacturing a bright trim part set-forth in claim 6, wherein the part is rotated during all of the spray coating steps in a range of 2 to 60 rpm.

10. The method for manufacturing a bright trim part set-forth in claim 6, wherein the part is rotated during all of the spray coating steps in a range of that will prevent the formation of a spray mottled orange peel surface on the finished part.

11. The method as defined in claim 1 wherein the part is fixed to a platform which is rotated about its central substantially horizontal axis.

12. The method as defined in claim 6 wherein the part is fixed to a platform which is rotated about its central substantially horizontal axis.

* * * * *